US008723368B2

(12) United States Patent
Choudhary et al.

(10) Patent No.: US 8,723,368 B2
(45) Date of Patent: May 13, 2014

(54) ELECTRICALLY TUNABLE INDUCTOR

(75) Inventors: Vijay N. Choudhary, Chandler, AZ (US); Robert Loke, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 510 days.

(21) Appl. No.: 13/204,413

(22) Filed: Aug. 5, 2011

(65) Prior Publication Data

US 2012/0169134 A1    Jul. 5, 2012

Related U.S. Application Data

(60) Provisional application No. 61/428,090, filed on Dec. 29, 2010.

(51) Int. Cl.
*H01F 27/42*  (2006.01)

(52) U.S. Cl.
USPC .......................................... 307/104

(58) Field of Classification Search
USPC .......................................... 307/104
See application file for complete search history.

(56) References Cited

U.S. PATENT DOCUMENTS

| 4,450,588 | A * | 5/1984 | Rohrich et al. | 455/192.1 |
| 7,741,734 | B2 | 6/2010 | Joannopoulos et al. | |
| 2009/0243397 | A1 * | 10/2009 | Cook et al. | 307/104 |
| 2010/0244583 | A1 * | 9/2010 | Shimokawa | 307/104 |

OTHER PUBLICATIONS

Yuequan Hu, et al.; "Universal-Input Single-Stage PFC Flyback with Variable Boost Inductance for High-Brightness LED Applications," IEEE (2010).
G. Vandevoorde, et al.; "Wireless energy transfer for stand-alone systems: a comparison between low and high power applicability," Published by Elsevier Science B.V. (2001).
Xiao Zhi Jian, et al.; "A Novel Wirless Charging System for Movable Telephone with Printed-circuit-board Windings of Different Structure and Shape Respectively," International Conference on Electrical Machines and Systems 2007, Oct. 8-11, Seoul, Korea.
Jun Pan, et al.; "A Self-Powered Sensor Module Using Vibration-Based Energy Generation for Ubiquitous Systems," IEEE (2005).
Geffrey K. Ottman, e t al.; "Adaptive Piezoelectric Energy Harvesting Circuit for Wireless Remote Power Supply," IEEE (2002).

(Continued)

*Primary Examiner* — Robert L. Deberadinis
(74) *Attorney, Agent, or Firm* — Eugene C. Conser; Wade J. Brady, III; Frederick J. Telecky, Jr.

(57) ABSTRACT

An electrically tunable inductor with an equivalent inductance includes a main winding and a tuning winding magnetically coupled to the main winding. The current through the tuning winding is controlled to adjust the equivalent inductance of the electrically tunable inductor. A device may include an electrically tunable inductor. A system may include multiple devices, one or more of the devices including an electrically tunable inductor. A tuning controller within the system may control the current in tuning windings of one or more of the multiple devices in the system. When an electrically tunable inductor is part of a resonant circuit, the resonant frequency may be controlled by adjusting the equivalent inductance of the electrically tunable inductor through controlling the current in the tuning winding. Controlling the current in the tuning winding includes one or more of controlling the peak, direction, frequency, duty cycle, or phase of the current.

19 Claims, 4 Drawing Sheets

(56) References Cited

OTHER PUBLICATIONS

C.-C., Tsai, B., et al.; "Design Wireless Transcutaneous Energy Transmission System for Totally Artificial Hearts," IEEE (2000).

David L. Mascarenas, et al.; "Experimental studies of using wireless energy transmission for powering embedded sensor nodes," Journal of Sound and Vibration, Published by Elsevier Ltd. (2009).

Jonsensor Zhao,; "A new calculation for designing multilayer planar spiral inductors," EDN (Jul. 29, 2010).

Takehiro Imura, et al, "Basic Experimental Study on Helical Antennas of Wireless Power Transfer for Electric Vehicles by using Magnetic Resonant Couplings," IEEE (2009).

Aristeidis Karalis, et al., "Efficient wireless non-radiative mid-range energy transfer," Elsevier, Science Direct, Annals of Physics, (2007).

Andre Kurs, et al., "Wireless Power Transfer via Strongly Coupled Magnetic Resonances," Science Express (Jun. 7, 2007).

Hideaki Abe, et al., "A Noncontact Charger Using a Resonant Converter with Parallel Capacitor of the Secondary Coil" 2000 IEEE Xplore.

Chwei-Sen Wang, et al., "Power Transfer Capability and Bifurcation Phenomena of Loosely Coupled Inductive Power Transfer Systems", 2004 IEEE Xplore.

R. Laouamer, et al., "A Multi-Resonant Converter for Non-Contact Charging with Electromagnetic Coupling," Jul. 22, 2010, IEEE Xplore.

\* cited by examiner

ELECTRICALLY TUNABLE INDUCTOR

CROSS REFERENCE TO RELATED APPLICATIONS

The present application claims benefit to U.S. provisional application 61/428,090 filed Dec. 29, 2010 entitled Electrically Tunable Inductor, the contents of which are incorporated herein in entirety.

BACKGROUND

Wireless power transfer between magnetically coupled transmitter and receiver resonant coils is at least in part dependent on the frequency difference of the transmitter and receiver resonant frequencies. Greater power transfer may be achieved when the transmitter and receiver resonant frequencies are equal. For some applications, it is optimal for the magnetically coupled resonant circuits to be tuned such that the resonant frequencies are equal.

In some magnetically coupled power transfer systems, resonant circuit components are switched on or off to adjust the resonant frequency. However, component tolerances and a limited number of discrete tuning components make it difficult to achieve high resolution tuning, and further difficult to achieve a wide tuning range.

In some magnetically coupled power transfer systems, a power transfer coil includes a saturated core for high resolution tuning. However, a saturated core is lossy and does not provide for high-Q power transfer.

In some magnetically coupled power transfer systems, components are adjusted by mechanical means. However, in many systems, mechanical adjustment is not feasible or not desirable in terms of cost, space, reliability, resolution, performance, or the like.

It would be desirable to provide for high-resolution tuning in a high-Q magnetic resonant wireless power transfer system, and further desirable to implement such tuning without mechanical movement.

FIGURES

DETAILED DESCRIPTION

A wireless power transfer system includes an electrically tunable inductor with a main winding and a tuning winding. A variable current passed through the tuning winding influences the flux through the main winding. As the current through the tuning winding is varied and the flux through the main winding correspondingly changes, power transfer is affected. Thus, current through the tuning winding may be controlled to adjust power transfer. The current through the tuning winding may be controlled for one or more of peak, direction, frequency, duty cycle, or phase.

Figure 1:
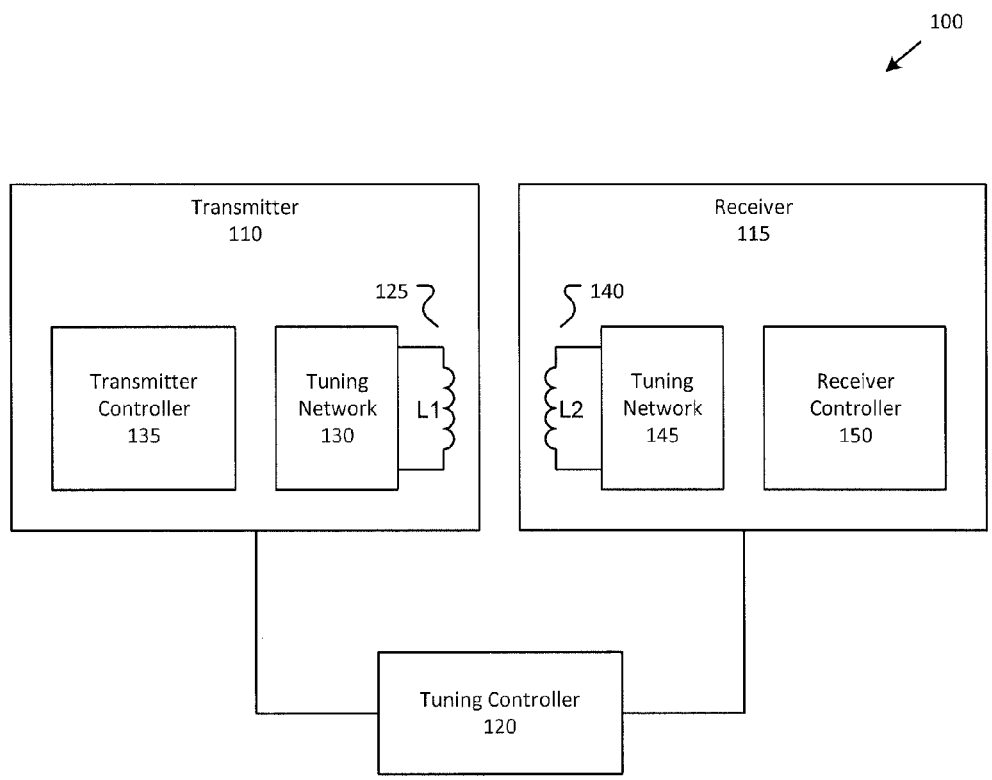
FIG. 1 illustrates a representative system for wireless power transfer.

FIG. 1 illustrates an exemplary wireless power transfer system 100 using magnetic resonance coupling, with resonance tuning provided by at least one electrically tunable inductor. System 100 includes a transmitter 110, a receiver 115, and a tuning controller 120.

Transmitter 110 in exemplary system 100 includes a power transfer coil 125 with inductance value L1, a tuning network 130, and a transmitter controller 135.

Power transfer coil 125 may be an electrically tunable inductor. Alternatively, coil 125 may be not tunable. For example, one of the transmitter 110 and receiver 115 may have an electrically tunable inductor while the other of the transmitter 110 and receiver 115 does not.

Power transfer coil 125 may be any one of, or a combination of, a number of types and geometries of coils. For example, coil 125 may be a helical coil, a loop, a trace, an open polygon, etc., may be one layer or multiple layers, and may be implemented on silicon, with wire, in a MEMS (micro-electromechanical system) device, etc. Further, coil 125 may be situated physically internal to a housing containing transmitter 110 or may alternatively by situated at least in part external to a housing containing transmitter 110.

Tuning network 130 may include circuit components which, along with transmitter coil 125, form a resonant circuit. The circuit components may include tuning components such as tunable capacitive devices. For example, in one implementation, tunable components within tuning network 130 may be used for coarse adjustment of resonant frequency, and an electrically tunable inductor used for fine tuning of the resonant frequency. Alternatively, all tuning may be via an electrically tunable inductor.

Tuning network 130 may further include circuit components that implement at least a portion of the current control for the tuning winding of an electrically tunable inductor, discussed in detail below.

Transmitter controller 135 includes circuit components for providing power to tuning network 130 and power transfer coil 125, as well as providing power for wireless power transfer to receiver 115. Transmitter controller 135 may include switching components for adjusting the voltage, frequency or duty cycle of a power supply output provided to tuning network 130 and coil 125.

Transmitter controller 135 may further include additional control circuitry, for example circuitry controlling tunable components within tuning network 135, controlling various circuits such as for turning the circuits on or off, or controlling tunable components within the power supply such as for adjusting magnitude, frequency or phase.

Transmitter 110 may include many more components than illustrated in FIG. 1. Some or all of the components of transmitter 110 may be integrated within one semiconductor device or within one semiconductor package including multiple semiconductor devices. Alternatively, one or more of the components of transmitter 110 may be implemented as separate components, for example, placed separately on a circuit board. The circuitry of transmitter 110 may be analog or digital or a combination of analog and digital.

Receiver 115 in exemplary system 100 includes a receiver power transfer coil 140 with inductance value L2, a tuning network 145, and a receiver controller 150.

Power transfer coil 140 is magnetically coupled to power transfer coil 125 of transmitter 110. Power transfer coil 140 may be an electrically tunable inductor. Alternatively, coil 125 may not be tunable. For example, one of the transmitter 110 and receiver 115 may have an electrically tunable inductor while the other of the transmitter 110 and receiver 115 does not.

Power transfer coil 140 may be any one of, or a combination of, a number of types and geometries of coils. For example, coil 140 may be a helical coil, a loop, a trace, an open polygon, etc., may be one layer or multiple layers, and may be implemented on silicon, with wire, in a MEMS (micro-electromechanical system) device, etc. Further, coil 140 may be situated physically internal to a housing containing receiver 115 or may alternatively by situated at least in part external to a housing containing receiver 115.

Tuning network 145 may include circuit components which, along with power transfer coil 140, form a resonant circuit. The circuit components may include tuning components such as tunable capacitive devices. For example, in one implementation, tunable components within tuning network 145 may be used for coarse adjustment of resonant frequency, and an electrically tunable inductor used for fine tuning of the resonant frequency. Alternatively, all tuning may be via an electrically tunable inductor.

Tuning network 145 may further include circuit components that implement at least a portion of the current control for the tuning winding of the electrically tunable inductor, discussed in detail below.

Receiver controller 150 includes circuit components for providing power to tuning network 145 and power transfer coil 140. Receiver controller 150 may include switching components for adjusting the voltage, frequency or duty cycle of a power supply output provided to tuning network 145 and coil 140.

Receiver controller 150 may further include additional control circuitry, for example circuitry controlling tunable components within tuning network 145, controlling various circuits such as for turning the circuits on or off, or controlling tunable components within the power supply such as for adjusting magnitude, frequency or phase.

Receiver 115 may include many more components than illustrated in FIG. 1. Some or all of the components of receiver 115 may be integrated within one semiconductor device or within one semiconductor package including multiple semiconductor devices. Alternatively, one or more of the components of receiver 115 may be implemented as separate components, for example, placed separately on a circuit board. The circuitry of receiver 115 may be analog or digital or a combination of analog and digital.

One or both of transmitter 110 and receiver 115 may include an electrically tunable inductor. One or both of transmitter 110 and receiver 115 may include other tunable components. However, one of transmitter 110 and receiver 115 may have no tunable components, and frequency tuning is performed solely by the device with tunable components.

There may be multiple receivers 115 receiving power from transmitter 110. Transmitter controller 135 may include control logic and circuits for switching the frequency of transmitter 110 between the resonant frequencies of the multiple receivers 115 in turn, and for controlling an electrically tunable inductor to fine tune transmitter 110 frequency to closely match each receiver 115 resonant frequency. Alternatively, transmitter 110 may operate at a fixed frequency, and the multiple receivers 115 may each tune to the transmitter 110 resonant frequency.

In a hybrid implementation in which at least one receiver 115 is not tunable, transmitter 110 may tune its frequency to the resonant frequency of the non-tunable receiver 115, and the tunable receivers 115 then tune their resonant frequencies to match transmitter 110.

In some implementations, multiple transmitters 110 may provide power to one or more receivers 115.

Tuning controller 120 controls the current through the electrically tunable inductor(s) of system 100. Although tuning controller 120 is illustrated in FIG. 1 as being a single component, there may be multiple tuning controllers 120 for multiple transmitters 110 or receivers 115. Further, a tuning controller 120 may be implemented within a transmitter 110 or a receiver 115.

A single tuning controller 120 may control multiple transmitters 110 or receivers 115, or a combination of transmitters 110 and receivers 115. A tuning controller 120 may be external to all transmitters 110 and receivers 115; for example, as a stand-alone device communicating with various transmitters 110 and receivers 115. Alternatively, a tuning controller 120 may be internal to one of a transmitter 110 or receiver 115, and may communicate with and control multiple transmitters 110 or receivers 115.

Tuning controller 120 may communicate with transmitters 110 and receivers 115 via a serial or parallel communication link, via a wireless communication link, or via signal lines. A transmitter 110 or receiver 115 communicates with tuning controller 120 to provide device information such as frequency, voltage, current, and the like. The device information is used by logic in tuning controller 120 to determine tuning control for the transmitter 110 or receiver 115. For example, a transmitter 110 may indicate present frequency to tuning controller 120, and in response, tuning controller 120 responds to transmitter 110 to adjust its frequency. In another example, receiver 115 may provide analog signals to tuning controller 120 representing power transfer coil 140 voltage and current, which tuning controller 120 uses to determine frequency and phase to then determine appropriate tuning for receiver 115. In yet another example, an analog signal representing power supply current is received by tuning controller 120 from a transmitter 110, and tuning controller 120 controls tuning of transmitter 110 to achieve a peak value of the analog signal. The examples given describe some of the many possible implementations for communication mechanisms and types of information communicated.

Figure 2A:
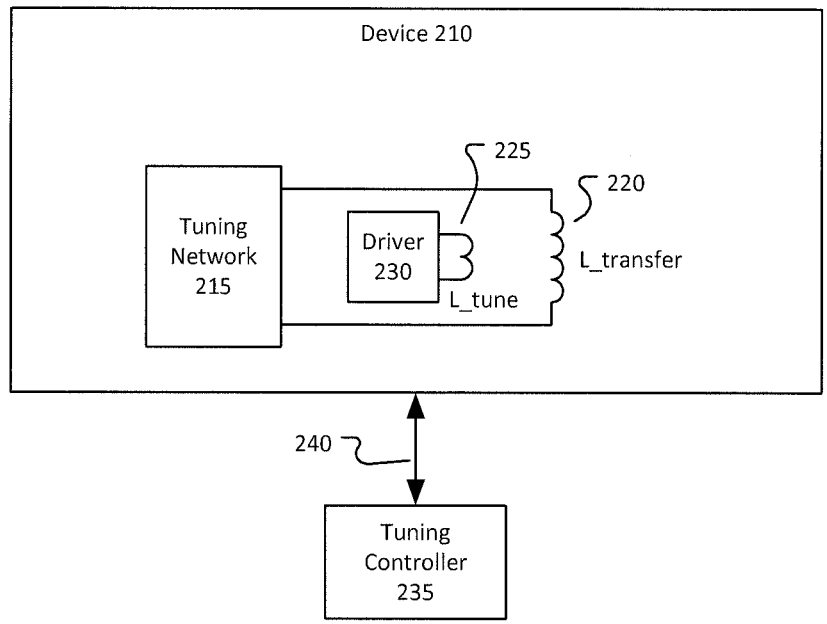
FIG. 2A illustrates a representative system for controlling an electrically tunable inductor.

FIG. 2A illustrates one example of communication and control between a device 210, for example a transmitter 110 or receiver 115, and a tuning controller 235 via communication interface 240.

Device 210 includes, among other components, a tuning network 215, similar to tuning networks 130 and 145, described above. Device 210 further includes a main winding, shown as power transfer coil 220 with inductance L_transfer. Coil 220 is similar to coils 125 and 140, described above.

Additionally, device 210 includes a tuning winding 225 with inductance L_tune, magnetically coupled to coil 220 and driven by driver 230. The physical implementation of tuning winding 225 is dependent upon the physical implementation of power transfer coil 220. For example, if coil 220 is implemented as a helical structure, then tuning winding 225 may be a wire wrapped one or more times around coil 220 and in contact or in close proximity to coil 220; may be placed within coil 220; or may be placed adjacent coil 220. For another example, if coil 220 is a trace on a semiconductor, tuning winding 225 may be an adjacent trace in the same plane or another plane; may be a component placed above the coil 220 trace on a printed circuit board; or the like. Many other implementations are possible.

Driver 230 provides a variable current to tuning winding 225 based on information received from tuning controller 235.

Tuning controller 235 determines frequency adjustments for device 210 and communicates the frequency adjustment information to device 210 via communication interface 240. For example, tuning controller 235 may communicate an adjustment factor such as delta value or a percent change value, along with a polarity indicator. For another example, tuning controller 235 may communicate an absolute desired frequency value. In some implementations, frequency adjustment information may be provided as electrical signals, such as analog values or pulse-width-modulated values, representing frequency or change in frequency. In some implementations, frequency adjustment information may be a value for the desired current through tuning winding 225.

As driver 230 adjusts the current through tuning winding 225, the magnetic field produced by the tuning winding 225 influences the magnetic field of coil 220. The effective inductance of the combination of tuning winding 225 and coil 220 changes as the magnetic field changes. For an implementation in which tuning network 215, coil 220, and tuning winding 225 are at least part of a resonant circuit, the change in effective inductance of the combination of tuning winding 225 and coil 220 causes the frequency of the resonant circuit to change.

Driver 230 may drive current through tuning winding 225 in either direction, allowing adjustment for an increase or a decrease in frequency. The current in tuning winding 225 may be adjusted in small steps, providing for higher resolution than is obtainable through discrete switching of capacitors and inductors.

Tuning controller 235 thus controls the amount of current flowing through tuning winding 225 to adjust the frequency of power transfer coil 220. In some implementations, tuning controller 235 may be included within a device 210.

Figure 2B:
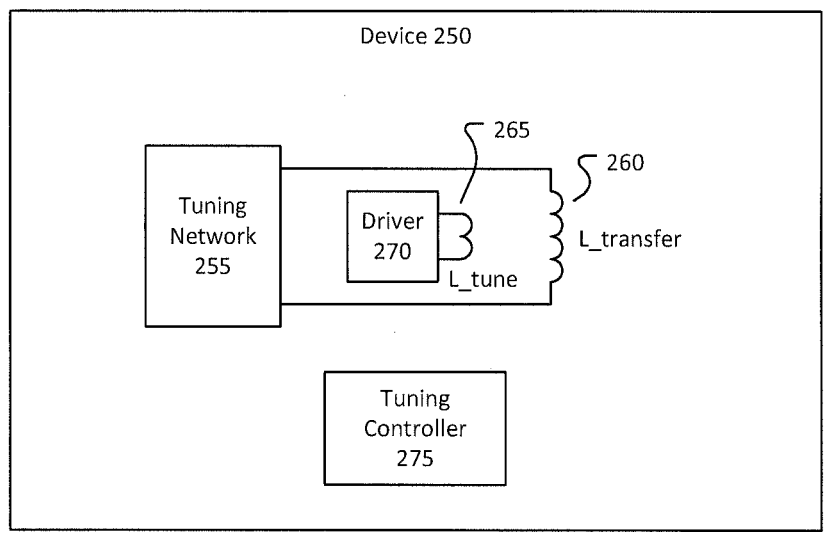
FIG. 2B illustrates another representative system for controlling an electrically tunable inductor.

FIG. 2B illustrates a device 250 at least similar to device 210 including a tuning network 255, a main winding shown as power transfer coil 260 with inductance L_transfer, a tuning winding 265 with inductance L_tune, a driver 270, and a tuning controller 275. Tuning network 255, coil 260, tuning winding 265, driver 270, and tuning controller 275 are at least similar to tuning network 215, coil 220, tuning winding 225, driver 230, and tuning controller 235, respectively. Tuning controller 275 may communicate directly with driver 270, and may further communicate with tuning network 255.

Figures 3A, 3B:
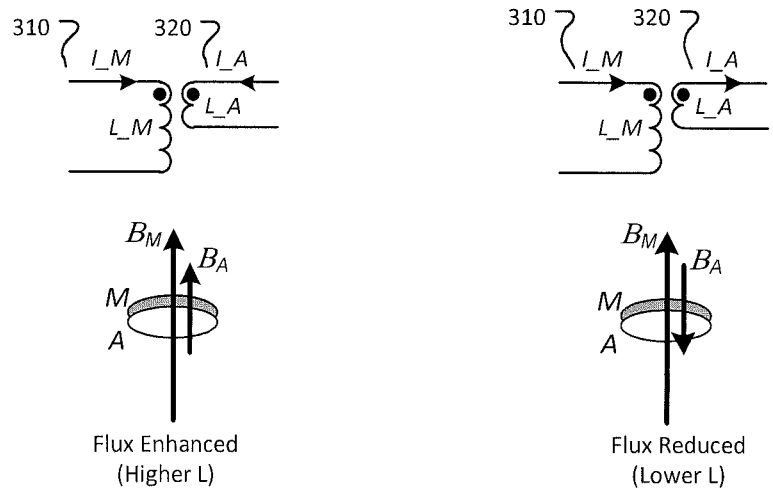
FIG. 3A illustrates additive polarity current in a tuning winding of an electrically tunable inductor.
FIG. 3B illustrates subtractive polarity current in a tuning winding of an electrically tunable inductor.

FIGS. 3A and 3B illustrate the bidirectional nature of the tuning winding 225 control.

FIG. 3A illustrates a power transfer coil 310 with inductance L_M proximate a tuning winding 320 with inductance L_A. Current I_M flows through coil 310, generating a magnetic field as represented by flux arrow BM and field M. Current I_A is controlled such that it flows as shown in FIG. 3A, generating a magnetic field as represented by flux arrow BA and field A. As illustrated in FIG. 3A, the two magnetic fields are additive, thus the effective inductance of the coil 310 and tuning winding 320 combined is increased.

FIG. 3B illustrates current I_A controlled such that it flows with opposite polarity from the illustration of FIG. 3A. As illustrated in FIG. 3B, the resulting two magnetic fields are subtractive. Thus, the effective inductance of the combined power transfer coil 310 and tuning winding 320 is decreased.

As the effective inductance of the combined power transfer coil 310 and tuning winding 320 changes, and consequently the frequency changes, it may desirable to control tuning winding 320 at a certain phase difference from coil 310. For example, it may be desirable to maintain a 180 degree phase difference or other phase difference, or to adjust phase difference to modify the system frequency response to respond to environment conditions. For another example, zero phase difference may be desirable for maximum power transfer. A phase lock loop may be added to maintain coil 310 and tuning winding 320 in phase with each other.

Figure 4:
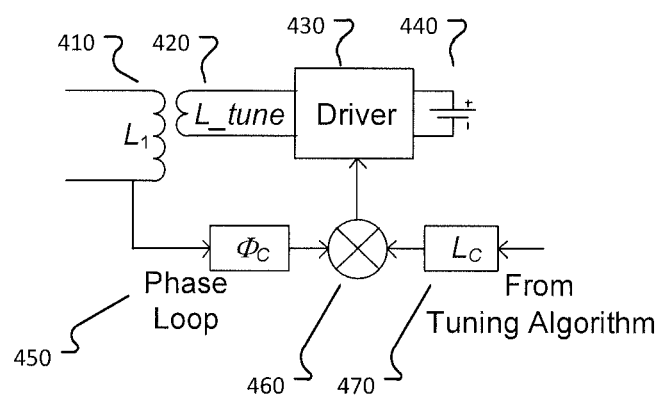
FIG. 4 illustrates the use of a phase lock loop with an electrically tunable inductor.

FIG. 4 illustrates a representative system including a phase lock loop. Power transfer coil 410 with inductance L1 is proximate tuning winding 420 with inductance L_tune. Driver 430 adjusts the current flowing through tuning winding 420. A power source 440 provides operating power for driver 430 and tuning winding 420. Phase loop 450 provides phase information in a feedback loop. Control mechanism 460 uses the phase information from phase loop 450 along with information regarding the desired change of inductance from block Lc to determine the appropriate magnitude and phase for the current through tuning winding 420. Control mechanism 460 may be implemented with hardware or with software, or with a combination of hardware and software.

Control mechanism 460 provides the magnitude and phase information to driver 430. Driver 430 may be implemented, for example, with an H-Bridge type structure, wherein phase is controlled by the timing of H-Bridge switch selections, and magnitude is controlled by the duration of H-Bridge switch closures, through pulse width modulation (PWM). Thus, the current through tuning winding 420 may be controlled for magnitude and phase.

The effective inductance L_eq for the combination of coil 310 and tuning winding 320 may be described by equation 1 for a system in which coil 310 and tuning winding 320 are in phase.

$$L\_eq = L\_M * (1 + n*y) \qquad (1)$$

Element 'n' of equation 1 is described by equation 2, where 'k' is the coupling factor of the coils. Variable 'y' of equation 1 is described by equation 3.

$$n = k * \sqrt{\frac{L\_A}{L\_M}} \qquad (2)$$

$$y = \frac{I\_A}{I\_M} \qquad (3)$$

Equations 2 and 3 indicate that a system may be designed with a broad range of frequency control through careful selection of inductance values and tuning current range.

Figure 5:
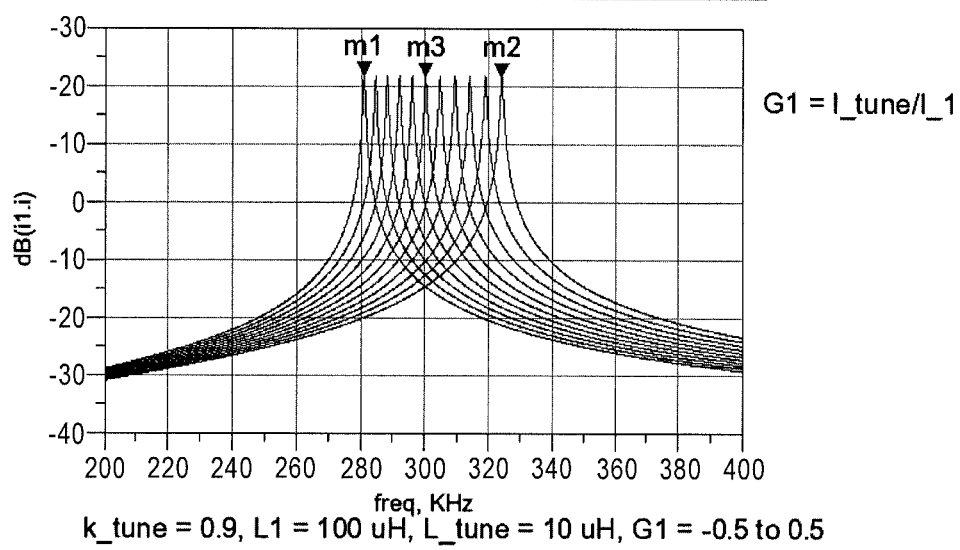
FIG. 5 illustrates the results of a simulation of a system including an electrically tunable inductor.

FIG. 5 illustrates the results of simulation of a circuit similar to the circuit of FIG. 4. In FIG. 5, 'k_tune', 'L1' and 'L_tune' are equivalent to 'k', 'L_M', and 'L_A' of equation 2, respectively, and G1 is equivalent to 'y' of equation 3. In FIG. 5, k=0.9, L_M=100 uH, L_A=10 uH, and y is varied between −0.5 and +0.5. As shown, the tuning winding current controls the resonant frequency of the resonant circuit. Three traces m1, m2, and m3 are labeled for the purpose of discussion.

Trace m3 represents approximately zero current I_A through the tuning winding, thus L_eq of equation 1 is approximately equal to the inductance of the power transfer coil. In the analyzed circuit, with zero tuning coil current, the resonant frequency is approximately 300 kHz. As the current in the tuning winding is increased with subtractive polarity to half the current through the power transfer coil, the resonant frequency is decreased to approximately 281 kHz, as seen in trace m1 of FIG. 5. As the current in the tuning winding is increased with additive polarity to half the current through the power transfer coil, the resonant frequency is increased to approximately 324 kHz, as seen in trace m2 of FIG. 5. Thus, the circuit as designed provides approximately a 40 kHz range of adjustment.

As current in the tuning winding increases, losses in the tuning winding also increase. It may therefore be desirable to minimize the current in the tuning winding. One option for minimizing the current in the tuning winding is to coarsely adjust the resonant frequency using tunable capacitors or inductors, and then finely tune the resonant frequency using a tuning winding.

CONCLUSION

It is to be understood that the above description is intended to be illustrative and not restrictive. Many embodiments and applications other than the examples provided would be apparent upon reading the above description. The scope of the invention should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the invention is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. An electrically tunable inductor with an equivalent inductance, comprising:
   a main winding configured to wirelessly transfer power;
   a tuning winding magnetically coupled to the main winding, the current through the tuning winding being controlled to adjust the equivalent inductance of the electrically tunable inductor;
   wherein, the current is being controlled by controlling the peak value of the current;
   wherein, the current is being controlled by selectively controlling the direction of current flow.

2. The electrically tunable inductor of claim 1, the current through the tuning winding being controlled by controlling the phase of the current.

3. The electrically tunable inductor of claim 2, the current being controlled to be one of:
   in-phase with the current through the main winding; or
   180 degrees out-of-phase with the current through the main winding.

4. The electrically tunable inductor of claim 1, the electrically tunable inductor being part of a resonant circuit, such that adjustment of the equivalent inductance causes adjustment of the resonant frequency in the resonant circuit.

5. The electrically tunable inductor of claim 4, the resonant circuit being part of a wireless transmitter.

6. The electrically tunable inductor of claim 4, the resonant circuit being part of a wireless receiver.

7. An apparatus, comprising:
   a power transfer coil configured for wireless power transfer;
   a tuning winding magnetically coupled to the power transfer coil, the power transfer coil when coupled with the tuning winding having an equivalent inductance; and
   a tuning controller controlling the current through the tuning winding by controlling the peak value of the current, the phase of the current, and selectively controlling the direction of the current flow, thereby controlling the equivalent inductance.

8. The apparatus of claim 7, the power transfer coil being a component in a resonant circuit, such that controlling the equivalent inductance further constitutes controlling the resonant frequency of the resonant circuit.

9. The apparatus of claim 8, further comprising:
   a tunable component in the resonant circuit, the tunable component being one of a tunable capacitor, a tunable inductor, or a tunable power source.

10. The apparatus of claim 9, the tunable component being a tunable power source, the tunable power source having one of tunable frequency or tunable phase.

11. The apparatus of claim 8, the apparatus being a wireless transmitter.

12. The apparatus of claim 8, the apparatus being a wireless receiver.

13. A system, comprising:
   a first device including;
      a power transfer coil configured for wireless power transfer; and
      a tuning winding magnetically coupled to the power transfer coil, the power transfer coil when coupled with the tuning winding having an equivalent inductance; and
   a second device including:
      a tuning controller controlling current through the tuning winding, thereby controlling the equivalent inductance;
      wherein the first device further includes a tuning network: the tuning network, the power transfer coil, and the tuning winding being part of a resonant circuit, such that adjustment of the equivalent inductance further adjusts the resonant frequency of the resonant circuit;
   wherein, the system is a wireless power transfer system and the first device being a transmitter, the second device including:
      at least one interface for receiving information from the first device and information from a third device that is a receiver;
      logic for determining an amount to adjust the resonant frequency of the resonant circuit in the first device based on the received information; and
      an interface for providing control information to the first device.

14. The system of claim 13, the system being a wireless power transfer system and the first device being a receiver, the second device including:
   at least one interface for receiving information from the first device and information from a third device that is a transmitter;
   logic for determining an amount to adjust the resonant frequency of the resonant circuit in the first device based on the received information; and
   an interface for providing control information to the first device.

15. The system of claim 13, further comprising a third device, the second device configured to receive information from the first device and information from the third device, and further configured to determine an amount to adjust the resonant frequency of the resonant circuit in the first device and a resonant circuit in the third device based on the received information.

16. The system of claim 13, further comprising:
a tunable component in the resonant circuit, the tunable component being one of a tunable capacitor, a tunable inductor, or a tunable power source.

17. The system of claim 13, the first device being a transmitter configured to wirelessly transfer power to a plurality of receivers.

18. The system of claim 13, the first device being a receiver configured to wirelessly receive power from a plurality of transmitters.

19. The system of claim 13, further comprising:
a plurality of transmitters configured to wirelessly transfer power to at least one receiver;
a plurality of receivers configured to wirelessly receive power from at least one transmitter;
the first device being one of a transmitter of the plurality of transmitters or a receiver of the plurality of receivers;
the second device providing control information to at least one transmitter of the plurality of transmitters and at least one receiver of the plurality of receivers.

\* \* \* \* \*